United States Patent [19]

Inoue et al.

[11] 4,193,835
[45] Mar. 18, 1980

[54] METHOD FOR GROWING SEMICONDUCTOR CRYSTAL

[75] Inventors: Morio Inoue; Kunio Itoh; Kunihiko Asahi, all of Takatsuki, Japan

[73] Assignee: Matsushita Electric Industrial Co., Ltd., Osaka, Japan

[21] Appl. No.: 839,407

[22] Filed: Oct. 5, 1977

[30] Foreign Application Priority Data

Oct. 13, 1976 [JP] Japan ................................ 51/123068

[51] Int. Cl.$^2$ .......................... B01J 17/36; B01J 17/40
[52] U.S. Cl. ..................................... 156/606; 148/189
[58] Field of Search ............... 156/606, 605, DIG. 70; 148/189; 252/62.3 E, 6 A; 427/85; 260/707, DIG. 35

[56] References Cited

U.S. PATENT DOCUMENTS

| | | | |
|---|---|---|---|
| 2,778,802 | 1/1957 | Willardson et al. | 252/62.36 A |
| 2,904,512 | 9/1959 | Horn | 156/605 |
| 3,421,952 | 1/1969 | Conrad et al. | 427/85 |
| 3,630,906 | 12/1971 | Willardson et al. | 156/605 |

FOREIGN PATENT DOCUMENTS

2500197  7/1975  Fed. Rep. of Germany ............. 427/85

OTHER PUBLICATIONS

Condensed Chemical Dictionary, 8th Ed., Hawley van Nostrand, Reinhold, 10, N.Y. 1971.

*Primary Examiner*—Hiram H. Bernstein
*Attorney, Agent, or Firm*—Burgess, Ryan and Wayne

[57] ABSTRACT

When a highly resistive GaAs film doped with a metal impurity such as Fe, Ni or Cr is epitaxially grown from the vapor phase, a metallocene of this metal impurity such as $Fe(C_5H_5)_2$, $Cr(C_5H_5)_2$ or $Ni(C_5H_5)_2$ or a derivative of this metallocene is employed as a starting material of this impurity. Even at room temperature or a temperature lower than room temperature a metallocene or a derivative thereof has such a high vapor pressure as to permit the epitaxial growth of a semi-insulating film so that heating of a line for feeding an impurity into a reaction tube may be eliminated and consequently an epitaxial system may be much simplified. Furthermore introduction of the impurity into the reaction tube may be instantaneously started or stopped by opening or closing a stop valve inserted into the feed line so that the impurity distribution may be sharply changed from one semi-insulating epitaxially grown film to another.

5 Claims, 5 Drawing Figures

(a)

(b)

(a)

(b)

METHOD FOR GROWING SEMICONDUCTOR CRYSTAL

BACKGROUND OF THE INVENTION

The present invention relates to a method for growing a semiconductor crystal from the vapor phase by adding or doping a metal element into a semiconductor substrate by gas decomposition process.

When a metal impurity is doped into a semiconductor so as to lower its energy level, the so-called "semi-insulating" semiconductor crystal having a suppressed conductivity may be obtained. For instance semi-insulating crystals added or doped with Cr find a variety of applications; that is, as a buffer layer in a field-effect transistor, an embedded layer in a semiconductor laser and so on. However there had not been proposed a method for permitting the addition or doping of a metal impurity such as Cr into a GaAs crystal in a simple manner. The existing apparatus are all extremely large and complex in construction yet incapable of providing crystals with desired qualities. For instance, when a semi-insulating GaAs film is epitaxially grown, a chloride of Cr, Fe or Ni must be heated to a high temperature so that a metal impurity may be doped into the GaAs film under high vapor pressure. More particularly in the process for epitaxially growing a semi-insulating GaAs film by the conventinal disproportionation, metallic gallium placed in a first zone in a reaction tube is made to come into contact with a gas mixture consisting of HCl and $H_2$ so that gaseous GaCl may be charged into a second zone wherein GaCl reacts with $AsH_3$ to yield GaAs. Concurrently $FeCl_2$ which is charged into the second zone through a separate feed line is decomposed into Fe which in turn is doped into GaAs to be deposited on a GaAs substrate placed in a third zone in the reaction tube. However the vapor pressure of $FeCl_2$ is low so that the vapor pressure must be increased by heating in order to permit Fe to be doped into GaAs. For instance, $FeCl_2$ must be heated to 700° C. so that it may have a vapor pressure of 10 Torr. To this end a preheating means must be provided so that not only a source of $FeCl_2$ but also a line for charging heated $FeCl_2$ into the furnace tube may be maintained at 700° C.

Furthermore when a field-effect transistor is fabricated, a semi-insulating GaAs film or a buffer layer is first grown on a substrate and then a GaAs film having a low impurity concentration or an active layer is grown on the buffer layer. However the charge of heated $FeCl_2$ into the reaction tube cannot be instantaneously suspended in practice because of the difficulty of closing a stop valve inserted in the $FeCl_2$ supply system which is heated to high temperatures. As a result the doping of Fe into the active layer cannot be avoided at the early stage in the crystal growth of this active layer so that the sharp change in resistivity cannot be attained at the interface between the buffer and active layers. Consequently the dimensional control of a channel region in a field-effect transistor is difficult and desired characteristics cannot be obtained.

SUMMARY OF THE INVENTION

One of the objects of the present invention is therefore to provide a method for growing a semiconductor crystal which may eliminate the preheating means of the type described so that a crystal from the vapor phase growing apparatus may be much simplified.

Another object of the present invention is to provide a method for growing a semiconductor crystal which may attain the impurity distribution which may sharply change from one film to another especially at the interface therebetween.

To the above and other ends, briefly stated the present invention provides a method for growing a semiconductor crystal characterized by employing a reaction gas containing the same elements with major elements contained in a semiconductor substrate and a chemical compound containing a metal element to be added to or doped into the semiconductor substrate.

DESCRIPTION OF THE PREFERRED EMBODIMENT

Figure 1:
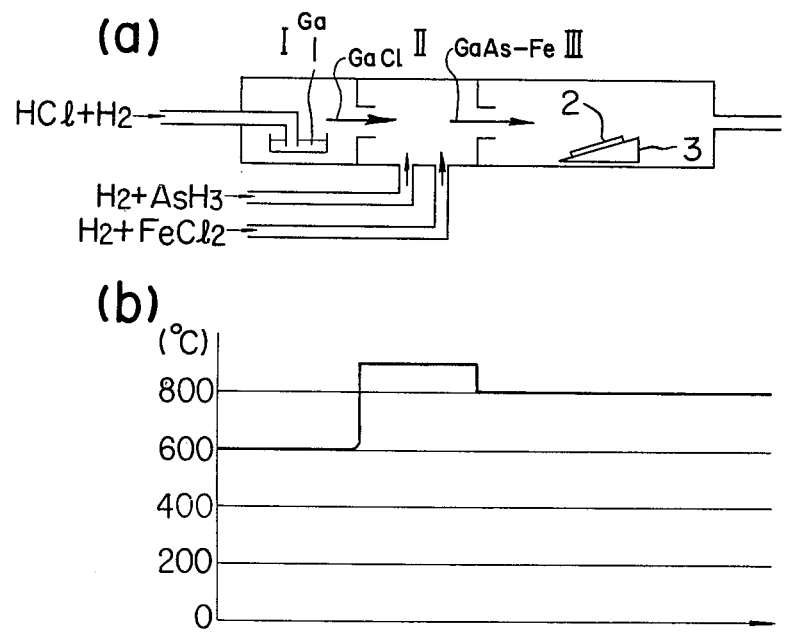
FIG. 1(a) is a schematic view of an apparatus used in a prior art vapor phase epitaxy.
FIG. 1(b) shows the temperature distribution within a reaction tube thereof.

Prior Art, FIG. 1

Prior to the description of the present invention, the prior art method for epitaxially growing a semi-insulating GaAs film by disproportionation will be described with reference to FIGS. 1(a) and 1(b). FIG. 1(a) is a schematic view of a reaction tube while FIG. 1(b) shows a temperature distribution therein. Ga 1 placed in a zone I reacts with a gas mixture consisting of HCl and $H_2$ and is converted into GaCl. GaCl in the form of gas or vapor is charged into a zone II where GaCl reacts with $AsH_3$ which has flown into the zone II and is converted into GaAs. $FeCl_2$ which is separately charged into the zone II is decomposed to yield Fe which in turn is doped into GaAs. Thus GaAs doped with Fe is deposited on a GaAs substrate 2 placed on a base 3 in zone III.

The vapor pressure of $FeCl_2$ is low so that in order to yield Fe sufficient in quantity for epitaxially growing a semi-insulating GaAs film, $FeCl_2$ must be heated to a high temperature so as to have a high vapor pressure before being charged into the zone II. For instance $FeCl_2$ must be heated to 700° C. so as to have the vapor pressure of 10 Torr. To this end an extra zone such as an electric furnace for maintaining $FeCl_2$ at elevated temperature must be provided.

In the process of manufacture of field-effect transistors, the semi-insulating GaAs film or a buffer layer is first grown on the substrate 2 and then an active layer or a film of GaAs with a low impurity concentration must be grown on the semi-insulating GaAs film. However the abrupt interruption of the flow of $FeCl_2$ in a system which is maintained at elevated temperature is impossible in practice because of the difficulty of operating a valve at high temperature. As a result the doping of the active layer with Fe at the earlier stage of the epitaxial growth thereof cannot be avoided. Consequently a steep resistance change cannot be attained at the interface between the buffer and active films, and the dimensional control of a channel region becomes difficult so that desired characteristics cannot be attained.

Figure 2:
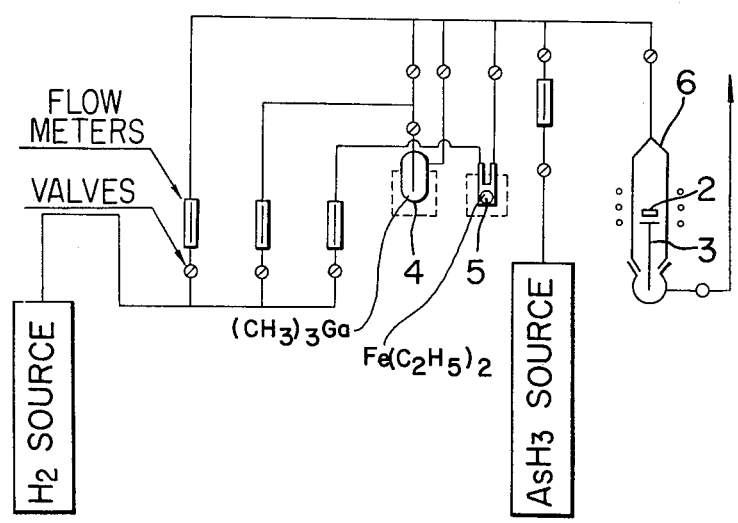
FIG. 2 is a schematic view of an apparatus adopted for carrying out the method of the present invention.
Figure 3:
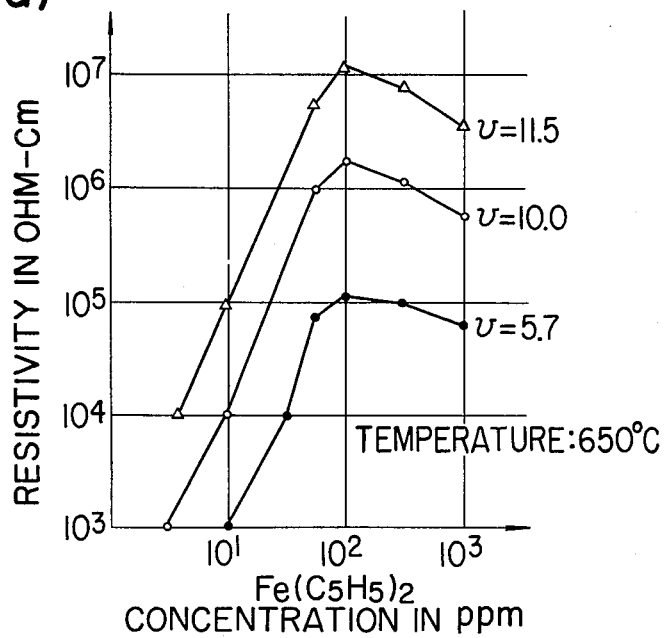
FIGS. 3(a) and 3(b) are graphs used for the explanation of the characteristics of GaAs films grown by the method of the present invention.
Figure 3:
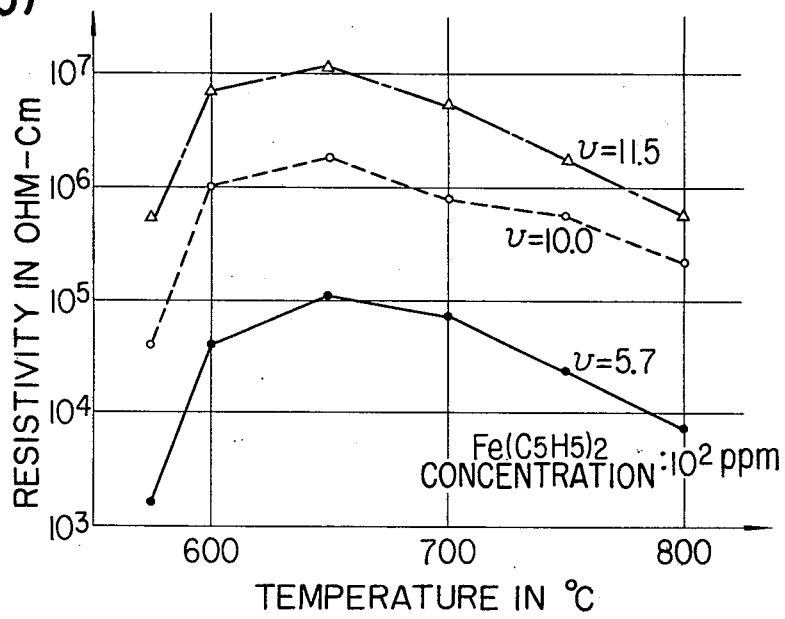

The Invention, FIGS. 2 and 3

In order to solve the above and other problems encountered in the prior art epitaxial processes, the present invention introduces into an epitaxial system an impurity such as Fe, Cr or Ni in the form of a metallocene expressed by $M(C_5H_5)_2$ where M is metal or in the form of a derivative of a metallocene. Metallocenes are for instance $Fe(C_5H_5)_2$, $Cr(C_5H_5)_2$ and $Ni(C_5H_5)_2$. The vapor pressure of a metallocene is in general so high that even at room temperature or a temperature lower than room temperature the epitaxial growth of a semi-insulating film may be successfully effected. Therefore heating of a supply or feed line for introducing for instance $Fe(C_5H_5)_2$ into a reaction tube may be omitted. Furthermore a stop valve may be inserted into this supply or feed line so that the charge of $Fe(C_5H_5)_2$ into the reaction tube may be immediately started or stopped so that the contamination of the active layer with the dopants in the semi-insulating layer may be avoided and consequently the properties of the active layer may be changed sharply from those of the semi-insulating layer.

Referring to FIGS. 2 and 3 the present invention will be described in detail in conjunction with the epitaxial growth of a GaAs film on a Cr-doped GaAs (semi-insulating) substrate by gas or vapor phase pyrolytic process. The GaAs semiconductor substrate 2 is placed on the holder 3 in the reaction tube 6. Trimethyl galluim is stored in a bubbler 4 and is maintained at $-10°$ C. Ferrocene $Fe(C_5H_5)_2$ which is a starting material of a dopant or Fe is stored in a U-tube 5 and is maintained also at $-10°$ C. Even at this low temperature $Fe(C_5H_5)_2$ has a high vapor pressure of 10 Torr which is a sufficiently high doping pressure.

Of various parameters which affect the epitaxial growth of GaAs, the temperature, the concentration of $Fe(C_5H_5)_2$ in a whole hydrogen gas and the flow rate ratio v between $Ga(CH_3)_3$ and $AsH_3$ are employed. The results of experiments conducted by the inventors are shown in FIGS. 3(a) and 3(b). The epitaxially grown films were two to three microns in thickness. Resistivity was measured by a four-probe method or Pauw method. FIG. 3(a) shows the relationship between the resistivity and the concentration of $Fe(C_5H_5)_2$ in the hydrogen gas when the temperature was fixed to 650° C. with the flow rate ratio v as a parameter. FIG. 3(b) shows the relationship between the resistivity and the temperature with the flow rate ratio v as a parameter when the concentration of $Fe(C_5H_5)_2$ was maintained at $10^2$ ppm.

Epitaxially grown films having a resistivity higher than $10^4$ ohm-cm can be obtained with high reproducibility when the temperature is between 600° and 800° C., the concentration of $Fe(C_5H_5)_2$ in the hydrogen gas is between 5 and $5 \times 10^2$ ppm and the flow rate ratio v between $Ga(CH_3)_3$ and $AsH_3$ is higher than 5. The highest resistivity of $1.2 \times 10^7$ ohm-cm was obtained when the $Fe(C_5H_5)_2$ concentration was $10^2$ ppm; the flow rate ratio v, 11.5 and the temperature, 650° C.

As described above, with $Fe(C_5H_5)_2$ as a starting material of a dopant, the epitaxially grown GaAs films may be obtained with a higher degree of reproducibility. Furthermore the reaction gas preparation systems are all operated at room temperature so that the $Fe(C_5H_5)_2$ feed line may be instantaneously stopped. As a consequence the resistance may be changed steeply or sharply between the GaAs layer thus grown and an additional active film further grown thereon and doped with another dopant.

In addition to $Fe(C_5H_5)_2$, $Cr(C_5H_5)_2$, $Ni(C_5H_5)_2$, $Mo(C_5H_5)_2$, $Mn(C_5H_5)_2$ and so on and their derivatives may be equally employed in the present invention. Moreover they may be used not only in the pyrolytic process but also in the gas phase process by disproportionation reaction or the liquid phase process.

Furthermore the method of the present invention may be also employed in doping Fe, Cr or Ni into various semiconductors consisting of elements from Groups III and V, Groups II and VI and Group IV.

In summary, according to the present invention when a metal is added or doped into a semiconductive substrate, a metallocene of this metal or derivative thereof is used as a starting material. Since a metallocene has a high vapor pressure, it is not necessary to heat a dopant metal to a high temperature so that a means for heating the dopant metal may be eliminated. Furthermore the charging of the metallocene into the reaction tube may be instantaneously started or stopped so that the epitaxial system may be much simplified and the epitaxial growth with a higher degree of reproducibility become possible.

What is claimed is:

1. A vapor phase epitaxial method for growing a semiconductor crystal comprising employing a reaction gas containing the same elements as the major elements in a semiconductor substrate and a chemical compound containing a dicyclopentadienyl metal, or derivative thereof, of a metal element to be added or doped into said semiconductor substrate, adding or doping said metal element into said semiconductor substrate.

2. A method as set forth in claim 1, wherein said dicyclopentadienyl metal is $Fe(C_5H_5)_2$, $Cr(C_5H_5)_2$, $Ni(C_5H_5)_2$, $Mo(C_5H_5)_2$ or $Mn(C_5H_5)_2$.

3. A method as set forth in claim 1, wherein said semiconductor substrate is GaAs, Si, CdS, InP or PbSe.

4. A vapor decomposition process for growing a semiconductor crystal comprising employing a reaction gas containing the same elements as the major elements contained in a semiconductor crystal substrate, a gaseous dicyclopentadienyl metal or derivative thereof containing a metal element to be added to or doped into said semiconductor crystal and a carrier gas or gases for transporting said reaction gas and said gaseous dicyclopentadienyl metal; maintaining the concentration of said dicyclopentadienyl metal in the range between 5 ppm and $10^3$ ppm based on the weight of said carrier gas or gases and the reaction temperature within the range between 600° C. and 800° C. and then adding or doping said metal element into said semiconductor substrate.

5. A process as set forth in claim 4, wherein said carrier gas is hydrogen, and said dicyclopentadienyl metal is ferrocene.

* * * * *